United States Patent
Loibl et al.

(10) Patent No.: US 9,805,771 B2
(45) Date of Patent: Oct. 31, 2017

(54) DETERMINING A STATE OF A CELL STRUCTURE

(71) Applicant: Infineon Technologies AG, Neubiberg (DE)

(72) Inventors: Ulrich Loibl, Munich (DE); Thomas Kern, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/190,435

(22) Filed: Feb. 26, 2014

(65) Prior Publication Data

US 2015/0243333 A1    Aug. 27, 2015

(51) Int. Cl.
| | |
|---|---|
| *G11C 11/4091* | (2006.01) |
| *G11C 7/06* | (2006.01) |
| *G11C 16/34* | (2006.01) |
| *G11C 29/02* | (2006.01) |
| *G11C 29/50* | (2006.01) |
| *G11C 11/16* | (2006.01) |
| *G11C 13/00* | (2006.01) |
| *G11C 17/00* | (2006.01) |

(52) U.S. Cl.
CPC .............. *G11C 7/06* (2013.01); *G11C 16/349* (2013.01); *G11C 29/028* (2013.01); *G11C 29/50* (2013.01); *G11C 7/062* (2013.01); *G11C 7/065* (2013.01); *G11C 11/16* (2013.01); *G11C 11/4091* (2013.01); *G11C 13/00* (2013.01); *G11C 17/00* (2013.01)

(58) Field of Classification Search
CPC ..... G11C 12/28; G11C 11/4091; G11C 7/065; G11C 7/062

USPC ............................................... 365/207
See application file for complete search history.

(56) References Cited

U.S. PATENT DOCUMENTS

| | | | |
|---|---|---|---|
| 7,638,999 B2 | 12/2009 | Kojovic et al. | |
| 7,902,813 B2 | 3/2011 | Kojovic et al. | |
| 8,223,517 B2 | 7/2012 | Kishida | |
| 9,196,320 B2 | 11/2015 | Kern et al. | |
| 2006/0203566 A1* | 9/2006 | Deml | G11C 16/0416 365/185.29 |
| 2007/0236208 A1 | 10/2007 | Kojovic et al. | |
| 2008/0320427 A1 | 12/2008 | Nakashima | |
| 2009/0116268 A1 | 5/2009 | Kishida | |
| 2010/0020457 A1 | 1/2010 | Kojovic et al. | |
| 2010/0232243 A1* | 9/2010 | Kobatake | G11C 16/28 365/207 |
| 2015/0170717 A1 | 6/2015 | Kern et al. | |

OTHER PUBLICATIONS

U.S. Appl. No. 14/190,804, filed Feb. 26, 2014. 28 Pages.
Non Final Office Action dated Oct. 5, 2015 U.S. Appl. No. 14/190,804.

(Continued)

*Primary Examiner* — Jason Lappas
(74) *Attorney, Agent, or Firm* — Eschweiler & Potashnik, LLC

(57) ABSTRACT

A method is suggested for determining a state of a cell structure, wherein the cell structure includes several memory cells, the method includes: (i) detecting a first condition in a predetermined number of memory cells; and (ii) determining the state of the cell structure by assigning a second condition to the memory cells that do not show the first condition.

18 Claims, 4 Drawing Sheets

| C_0 | C_1 | C_2 | C_3 | |
|---|---|---|---|---|
| 0 | 1 | 0 | 1 | ⎫ |
| 0 | 1 | 1 | 0 | ⎬ 101 |
| 1 | 0 | 0 | 1 | ⎪ |
| 1 | 0 | 1 | 0 | ⎭ |
| 0 | 0 | 1 | 1 | ⎫ 102 |
| 1 | 1 | 0 | 0 | ⎭ |

(56) References Cited

OTHER PUBLICATIONS

Final Office Action dated Apr. 5, 2016 U.S. Appl. No. 14/190,804.
Non Final Office Action dated Jul. 21, 2016 U.S. Appl. No. 14/190,804.
Notice of Allowance dated Dec. 21, 2016 in connection with U.S. Appl. No. 14/190,804.

* cited by examiner

301

302

303

| Number of Cells | Number of Zeroes | Number of States |
|---|---|---|
| 4 | 2 | 6 |
| 4 | 1 | 4 |
| 4 | 3 | 4 |
| 6 | 3 | 20 |
| 6 | 2 | 15 |
| 6 | 4 | 15 |
| 8 | 4 | 70 |
| 8 | 3 | 56 |
| 8 | 5 | 56 |
| 5 | 3 | 10 |
| 5 | 2 | 10 |
| 5 | 1 | 5 |
| 7 | 4 | 35 |
| 7 | 3 | 35 |
| 7 | 2 | 21 |
| 7 | 1 | 7 |

DETERMINING A STATE OF A CELL STRUCTURE

BACKGROUND

Embodiments of the present disclosure relate to a detection of a state of a cell structure, wherein the cell structure comprises several memory cells, in particular complement memory cells of a differential read memory.

SUMMARY

A first embodiment relates to a method for determining a state of a cell structure, wherein the cell structure comprises several memory cells. The method comprises detecting a first condition in a predetermined number of memory cells, and determining the state of the cell structure by assigning a second condition to the memory cells that do not show the first condition.

A second embodiment relates to a device. The device comprises a memory comprising at least one cell structure, wherein the cell structure comprises several memory cells, and a processing unit configured to detect a first condition in a predetermined number of memory cells, and determine the state of the cell structure by assigning a second condition to the memory cells that do not show the first condition.

A third embodiment relates to a device for determining a state of a cell structure, wherein the cell structure comprises several memory cells. The device comprises means for detecting a first condition in a predetermined number of memory cells, and means for determining the state of the cell structure by assigning a second condition to the memory cells that do not show the first condition.

A fourth embodiment is directed to a computer program product directly loadable into a memory of a digital processing device, comprising software code portions for performing the method described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

The introduction of a differential read in a non-volatile memory (NVM) improves reliability, e.g., even after a high number of write/erase cycles, but requires (at least) two NVM cells (also referred to as a cell pair) per data bit. The data bit may thus be represented by a complement cell, wherein the complement cell comprises at least one true cell and at least one complementary cell. In particular, the complement cell may comprise an equal number of true and complementary cells.

For example, a logical "0" of a complement cell (representing the data bit) can be associated with a physical "0" of the true cell and a physical "1" of the complementary cell. A logical "1" of the complement cell can be associated with a physical "1" of the true cell and a physical "0" of the complementary cell.

It is noted that a physical "0" can be regarded as a physical property assigned to a state "0". Accordingly, a physical "1" can be regarded as a physical property assigned to a state "1".

Hence, two associated NVM cells of a memory may store complementary information, i.e., they have opposite states. In a common complement cell, only a bit that has complementary cell states can be successfully decoded, i.e., one of the two cells of a cell pair has to be in the written state and the other cell has to be in the erased state to allow for successful data decoding.

The physical differences between the cells of a complement cell (i.e., the true cell and the complementary cell) may be based on a variation of a voltage, a resistance, a current and/or a variation of a signal over time. Due to cycling, aging or temperature effects, the physical differences may lead to additional shifts which may impede the detection of the complement data.

In general, detection of information stored in a NVM may need a reference signal between two states representing "0" and "1" and/or a complementary bit (resulting in a complement cell as explained above).

The reference signal is sensitive to level shifts and the complement cell approach requires at least two cells per bit, which results in a significant overall cell overhead.

The examples described herein in particular introduce a concept that is robust and reduces the overhead compared to the known complement cell approach.

Figure 1:
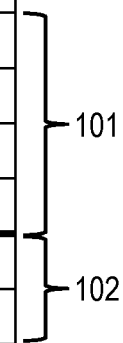
FIG. 1 shows a cell structure comprising several physical memory cells and a table representing various states of each of these memory cells.

FIG. 1 schematically shows a cell structure comprising several physical cells C_0, C_1, C_2 and C_3 and a table representing various states of each of these cells.

The cells C_0 and C_1 can be regarded as a first complement cell representing a first bit and the cells C_2 and C_3 can be regarded as a second complement cell representing a second bit. Each of the first and second complement cells may represent a bit with a binary state "0" or "1", wherein for each of the respective memory cells of the complement cell show different physical states. This corresponds to the common complement cell approach and is summarized as a portion 101 of the table shown in FIG. 1.

This complement cell approach can be extended to a cell structure comprising more than two cells, in particular, to at least two cell pairs, wherein the cell structure allows more than two coding combinations per cell pair (wherein each coding combination may also be referred to as "state"). For example, a portion 102 of the table shown in FIG. 1 shows identical states of the cells C_0 and C_1 and of the cells C_2 and C_3, wherein in total each line of the table shown in FIG. 1 always comprises two "1" and two "0" values. For a valid combination of values (shown in a line of the table), it is in particular an option that the number of "1"s and the number of "0"s is equal.

It is noted that the cell pair may comprise a true cell and a complementary cell. The cell structure may in particular comprise several cell pairs which allows for additional states (i.e. coding combinations) that may be utilized in various ways. It is also an option that the cell structure comprise cells that are not part of cell pairs. It is in particular an option that the cell structure comprises an odd number of cells.

In the example shown in FIG. 1, the cell structure comprising two cell pairs allows for six coding combinations instead of the four coding combinations (two bits with $2^2$ combinations) of two common complement cells.

Hence, while classical complement sensing deploys searches for the "0" or "1" values within two cells, it is suggested to detect a number of m "0" values or a number of n "1" values within m+n cells. In this regard, FIG. 1 shows an example for m=n=2.

Figure 2:
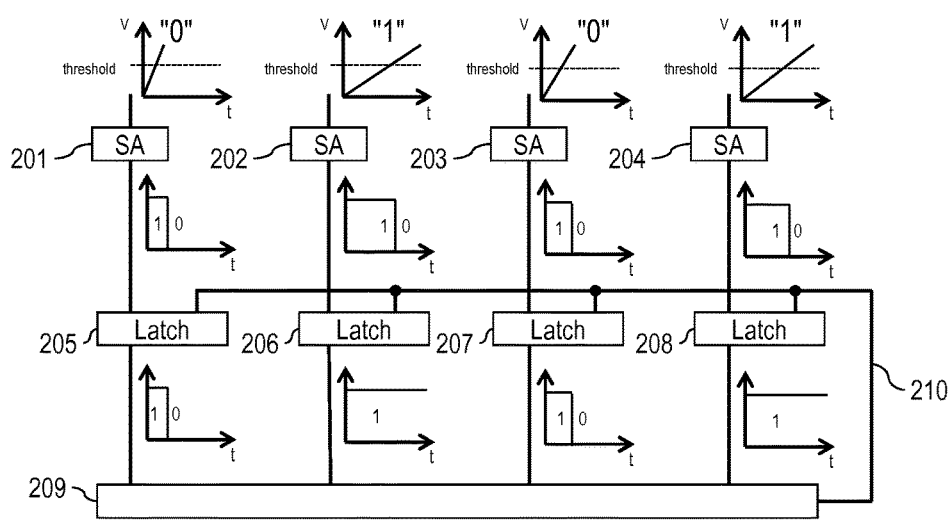
FIG. 2 shows an implementation of the example shown in FIG. 1 utilizing four cells to provide six valid coding combinations.

FIG. 2 shows an implementation of the example shown in FIG. 1 utilizing four cells to provide six valid coding combinations.

FIG. 2 shows several latches 205 to 208. Each of the latches 205 to 208 may have an input EN (enable input) and an input D (data input). When the input EN is set to "0", the output of the respective latch remains unchanged regardless of its input D, the latch is in a so-called frozen state. If the input EN is set to "1", the output of the latch corresponds to its input D, it is operated in a so-called "transparent" mode.

A current of a memory cell is transformed into the time domain. Such transformation can be realized by integrating the current I via a capacitor C up to a trip point of a voltage V. FIG. 2 shows that a logic "0" signal can be detected earlier than a logic "1" signal.

A logic "0" signal of the cell C_0 is fed to a sense amplifier (SA) 201, a logic "1" signal of the cell C_1 is conveyed to a sense amplifier 202, a logic "0" signal of the cell C_2 is conveyed to a sense amplifier 203 and a logic "1" signal of the cell C_3 is conveyed to a sense amplifier 204.

The latches 205 to 208 are in the transparent mode. A logic 209 determines when the first two "0" values have been detected (it "catches the fastest two '0' values"), then freezes the latches 205 to 208 via a hold signal 210 (setting the EN inputs of the latches 205 to 208 to "0").

Hence, an early-switching sense amplifier represents a high cell current. After each reset of the cell structure (in the example shown in FIG. 2 the cell structure comprises four memory cells C_0 to C_3), the logic 209 detects the first two "0" values in the memory cells, then freezes the latches 205 to 208. Hence, the outputs of the latches 205 to 208 show two "0" values and two "1" values.

Figure 3:
FIG. 3 shows an example table indicating a number of memory cells used in the cell structure, a number of zeroes to be detected by a logic unit and the resulting number of states (coding combinations) provided by such an example cell structure.
Figure 3:
Figure 3:

The concept introduced may be extended to a different number of bits and coding combinations. FIG. 3 shows an example table indicating a number of memory cells 301 used in the cell structure, a number of zeroes 302 to be detected by a logic (like the logic 209 shown in FIG. 2) and the resulting number of states (coding combinations) 303 provided by such an example cell structure. The number of states 303 can be determined based on the number of cells NC 301 and the number of zeroes NZ 302 as follows:

$$\binom{NC}{NZ} = \frac{NC!}{NZ! \cdot (NC-NZ)!}$$

For example in case NC=6 and NZ=3 the overhead compared to a common complement cell approach is reduced to 50% (4 bits (16 states) can be coded instead of 3 bits (8 states)).

The examples suggested herein may in particular be based on at least one of the following solutions. In particular combinations of the following features could be utilized in order to reach a desired result. The features of the method could be combined with any feature(s) of the device, apparatus or system or vice versa.

A method is suggested for determining a state of a cell structure, wherein the cell structure comprises several memory cells. The method comprises detecting a first condition in a predetermined number of memory cells, and determining the state of the cell structure by assigning a second condition to the memory cells that do not show the first condition.

The cell structure comprises several memory cells, each of the memory cells may indicate a logical state "0" or "1". Based on the first condition, which may in particular be apparent sooner than the second condition, the state of the cell structure, in one embodiment, comprising a sequence of logical states (each represented by one memory cell) can be determined after a pre-defined number of memory cells showed the first condition. Then, the remaining memory cells are assumed to have the second condition. For example, if the first condition corresponds to logic "0", a bit sequence of the cell structure can be determined after the pre-defined number of memory cells showed "0".

In an embodiment, the method comprises transforming electrical variables for each memory cell into a time domain, and detecting the first condition in a predetermined number of memory cells by comparing the transformed electrical variables with a threshold.

The electrical variable may be a current or a voltage of the memory cell or associated with the memory cell. The respective current or a voltage derived from the current may be transformed into the time domain, e.g., via integration. Hence, a time (or duration) may indicate the amount of the electrical variable, i.e., current or voltage. This amount can be compared with a threshold.

By transforming the electrical variable into the time domain, the first condition may be determined (e.g., via a sense amplifier sensing a read current of the memory cell) sooner than the second condition. If a predetermined number of memory cells show the first condition, the race may be stopped (the status of the memory cells may be frozen) and the state of the cell structure can be determined by the memory cells indicating the first condition and the remaining memory cells indicating the second condition.

The comparisons may lead to a racing condition in the time domain. For example, the comparison may be conducted by storing output values (e.g., a voltage read by a sense amplifier for each memory cell) in latches (one latch can be provided for each sense amplifier) and by determining the first k first conditions via a logic unit. After the k first conditions are detected the latches can be locked and the result at the latches may indicate the bit sequence stored in the cell structure.

In an embodiment, the threshold is adjustable.

The threshold may in particular be flexibly adjustable according to a particular use-case scenario.

In an embodiment, the first condition is a logic state corresponding to a logic "0" or a logic "1".

In an embodiment, the second condition is a logic state corresponding to a logic "0" or a logic "1" and wherein the second condition is different from the first condition.

In an embodiment, the first condition can be determined prior to the second condition.

In an embodiment, the first condition corresponds to a first physical condition that can be detected earlier than a second physical condition that corresponds to the second condition.

In an embodiment, the cell structure comprises several complement cells.

The complement cell comprises at least one true (memory) cell and at least one complementary (memory) cell. For example, the complement cell may comprise a pair of cells with one true cell and one complementary cell. It is also an option that the complement cell comprises several pairs of cells. The cells are advantageously arranged on the same piece of memory.

In an embodiment, the memory cells are part of the same portion of memory.

The memory cells may be part of a non-volatile memory, in particular part of a sector or a page of a memory. It is noted that the memory cells may be part of a portion of memory that is (in total) subject to an erase procedure.

In an embodiment, the several memory cells are represented by a group of at least two memory cells, wherein at least two memory cells of this group are complementary cells of a differential read memory.

In an embodiment, the differential read memory comprises at least one of the following: floating gate cells, PCRAM, RRAM, MRAM, MONOS devices, nano crystal cells, and ROM.

In an embodiment, the memory cells are memory cells of a non-volatile memory.

A device is provided, wherein the device comprises a memory comprising at least one cell structure, wherein the cell structure comprises several memory cells. The device further comprises a processing unit configured to detect a first condition in a predetermined number of memory cells, and determine the state of the cell structure by assigning a second condition to the memory cells that do not show the first condition.

In an embodiment, the device further comprises a conversion stage for transforming electrical variables for each memory cell into a time domain. In such an embodiment the processing unit is configured to detect the first condition in a predetermined number of memory cells by comparing the transformed electrical variables with a threshold.

In an embodiment, the conversion stage is arranged to transform the electrical variables into the time domain such that the first condition becomes apparent sooner than the second condition.

In an embodiment, the several memory cells are represented by a group of at least two memory cells, wherein at least two memory cells of this group are complementary cells of a differential read memory.

In an embodiment, the differential read memory comprises at least one of the following: floating gate cells, PCRAM, RRAM, MRAM, MONOS devices, nano crystal cells, and ROM.

Also, a device is suggested for determining a state of a cell structure, wherein the cell structure comprises several memory cells. The device comprises means for detecting a first condition in a predetermined number of memory cells, and means for determining the state of the cell structure by assigning a second condition to the memory cells that do not show the first condition.

Figure 4:
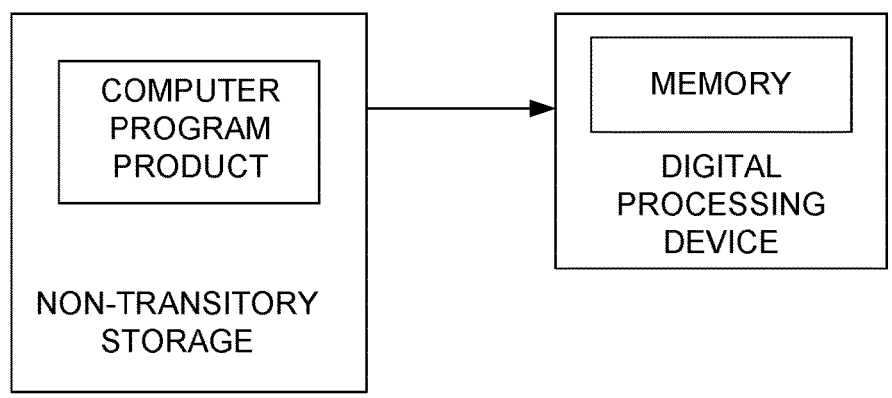
FIG. 4 shows a computer program product, being directly loadable into a memory of a digital processing device.

A computer program product is provided, being directly loadable into a memory of a digital processing device, comprising software code portions for performing the steps of the method as described herein, as illustrated in FIG. 4.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various example embodiments of the disclosure have been disclosed, it will be apparent to those skilled in the art that various changes and modifications can be made which will achieve some of the advantages of the disclosure without departing from the spirit and scope of the disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for determining a state of a cell structure, wherein the cell structure comprises several memory cells, comprising:
   detecting a first condition in a predetermined number of memory cells of the cell structure and stopping a race condition in the time domain in response to the first condition detection;
   assuming a second, different condition in the remaining cells of the cell structure where the first condition is not detected when the race condition was stopped; and
   determining the state of the cell structure by assigning the second condition to the memory cells that do not show the first condition.

2. The method according to claim 1, further comprising:
   transforming electrical variables for each memory cell into a time domain; and
   detecting the first condition in a predetermined number of memory cells by comparing the transformed electrical variables with a threshold.

3. The method according to claim 2, wherein the threshold is adjustable.

4. The method according to claim 1, wherein the first condition is a logic state corresponding to a logic "0" or a logic "1".

5. The method according to claim 1, wherein the second condition is a logic state corresponding to a logic "0" or a logic "1" and wherein the second condition is different from the first condition.

6. The method according to claim 1, wherein the first condition is apparent sooner than the second condition and is determined prior to the second condition.

7. The method according to claim 1, wherein the first condition corresponds to a first physical condition that can be detected earlier than a second physical condition that corresponds to the second condition.

8. The method according to claim 1, wherein the cell structure comprises several complement cells.

9. The method according to claim 1, wherein the memory cells are part of the same portion of memory.

10. The method according to claim 1, wherein the several memory cells are represented by a group of at least two memory cells, and wherein at least two memory cells of this group are complementary cells of a differential read memory.

11. The method according to claim 10, wherein the differential read memory comprises at least one of the following:
   floating gate cells;
   PCRAM,
   RRAM,
   MRAM,
   MONOS devices,
   nano crystal cells, and
   ROM.

12. The method according to claim 1, wherein the memory cells are memory cells of a non-volatile memory.

13. A device, comprising:
   a memory comprising at least one cell structure, wherein the cell structure comprises several memory cells; and
   a processing unit configured to:
      detect a first condition in a predetermined number of memory cells of the at least one cell structure and stop a race condition in the time domain in response to the first condition detection;
      assume a second, different condition in the remaining memory cells of the at least one cell structure where the first condition is not detected when the race condition was stopped; and
      determine the state of the cell structure by assigning the second condition to the memory cells that do not show the first condition.

14. The device according to claim 13, further comprising:
   a conversion stage for transforming electrical variables for each memory cell into a time domain,
   wherein the processing unit is arranged for detecting the first condition in a predetermined number of memory cells by comparing the transformed electrical variables with a threshold.

15. The device according to claim 14, wherein the conversion stage is configured to transform the electrical variables into the time domain such that the first condition becomes apparent sooner than the second condition.

16. The device according to claim 13, wherein the several memory cells are represented by a group of at least two memory cells, wherein at least two memory cells of this group are complementary cells of a differential read memory.

17. The device according to claim 16, wherein the differential read memory comprises at least one of the following:
   floating gate cells;
   PCRAM,
   RRAM,
   MRAM,
   MONOS devices,
   nano crystal cells, and
   ROM.

18. A computer program product stored in a non-transitory storage medium directly loadable into a memory of a digital processing device, comprising software code portions for performing the method according to claim 1.

* * * * *